United States Patent
Chang et al.

(10) Patent No.: US 9,064,088 B2
(45) Date of Patent: Jun. 23, 2015

(54) COMPUTING DEVICE, STORAGE MEDIUM AND METHOD FOR ANALYZING STEP FORMATTED FILE OF MEASUREMENT GRAPHICS

(75) Inventors: Chih-Kuang Chang, New Taipei (TW); Xin-Yuan Wu, Shenzhen (CN); Bo Nie, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 438 days.

(21) Appl. No.: 13/555,085

(22) Filed: Jul. 21, 2012

(65) Prior Publication Data
US 2013/0111339 A1 May 2, 2013

(30) Foreign Application Priority Data
Oct. 28, 2011 (CN) .......................... 2011 1 0333583

(51) Int. Cl.
G06F 17/22 (2006.01)
G06F 17/50 (2006.01)

(52) U.S. Cl.
CPC ................................ *G06F 17/5086* (2013.01)

(58) Field of Classification Search
USPC ................................ 715/200, 256, 267, 273
See application file for complete search history.

(56) References Cited

U.S. PATENT DOCUMENTS

| | | | | |
|---|---|---|---|---|
| 5,886,702 A * | 3/1999 | Migdal et al. | | 345/423 |
| 6,738,727 B2 * | 5/2004 | Chang | | 702/167 |
| 6,813,749 B2 * | 11/2004 | Rassaian | | 703/7 |
| 6,834,253 B2 * | 12/2004 | Wu et al. | | 702/155 |
| 7,761,265 B2 * | 7/2010 | Regli et al. | | 703/2 |
| 2002/0007294 A1 * | 1/2002 | Bradbury et al. | | 705/7 |
| 2003/0204344 A1 * | 10/2003 | Wu et al. | | 702/68 |
| 2003/0204366 A1 * | 10/2003 | Chang | | 702/167 |
| 2003/0208285 A1 * | 11/2003 | Regli et al. | | 700/30 |
| 2004/0102938 A1 * | 5/2004 | Nakashima et al. | | 703/2 |
| 2004/0243481 A1 * | 12/2004 | Bradbury et al. | | 705/26 |
| 2008/0034333 A1 * | 2/2008 | Chang et al. | | 716/3 |

OTHER PUBLICATIONS

Mannisto et al. "Modelling generic product structures in STEP", Computer-Aided Design, pp. 1111-1118, 1998.*
V. Kern, "STEP Database for Product Data Exchange", 6 pages, Sep. 4-7, 1997.*

(Continued)

*Primary Examiner* — Maikhanh Nguyen
(74) *Attorney, Agent, or Firm* — Novak Druce Connolly Bove + Quigg LLP

(57) ABSTRACT

A computing device performs a method to analyze a STEP (standardized exchange of product) formatted file of a measurement graphics, and to predefine one or more graphic keywords and graphics analysis modes in a storage device of the computing device. The method extracts a content keyword and a content character string from each line of the STEP formatted file, and analyzes the content keywords and the content character strings to obtain shell data of the graphic elements. The method further draws a geometrical shell of the measurement graphics according to the shell data using a curve meshing method, marks boundaries of the geometrical shell using an indication mark, and displays the measurement graphics with the indication mark on a display device of the computing device.

15 Claims, 9 Drawing Sheets

(56) References Cited

OTHER PUBLICATIONS

V. Kern, "Maintaining Semantics in the Intergration of Network Interoperable Product Data Models", Dec. 1997.*
Choi et al. "Exchange of CAD Part Models Based on the Macro-Parametric Approach", International Journal of CAD/CAM, pp. 13-21, 2002.*
Yoo et al. "Web-based knowledge management for sharing product data in virtual enterprises", Int. J. Production Economics, 2002, pp. 173-183.*
Dereli et al. A note on the use of STEP for interacting design to process planning,Computer-Aided Design, 2002, pp. 1075-1085.*
Zhang et al. "A review of Internet-based product information sharing and visualization", Computers in Industry, 2004, pp. 1-5.*

* cited by examiner

COMPUTING DEVICE, STORAGE MEDIUM AND METHOD FOR ANALYZING STEP FORMATTED FILE OF MEASUREMENT GRAPHICS

BACKGROUND

1. Technical Field

Embodiments of the present disclosure relate to files analysis systems and methods, and particularly to a computing device, a storage medium, and a method for analyzing a STEP formatted file of a measurement graphics.

2. Description of Related Art

Many computer aided design (CAD) vendors use two-dimensional (2D) or three-dimensional (3D) geometry elements to design a measurement product. Problems arise when the vendors wish to export geometrical data of a STEP (Standardized Exchange of Product) formatted file to a CAD system for further analysis. The STEP formatted file is most widely used in data exchange in the design process of the measurement product, and the geometrical data of the STEP formatted file are easily read.

However, the vendors cannot analyze the STEP formatted file to obtain the 3D drawings using the CAD system, and also cannot extract the geometry elements (e.g., rectangular solid, cylinder, sphere, ellipsoid) from the 3D drawings. To analyze the STEP formatted file, the DXF graphic file should be converted to a compatible format graphic file such as a DWG format using a special drawing conversion system, which is costly and inefficient.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

In the present disclosure, the word "module," as used herein, refers to logic embodied in hardware or firmware, or to a collection of software instructions, written in a program language. In one embodiment, the program language may be Java™, C, or assembly. One or more software instructions in the modules may be embedded in firmware, such as in an EPROM (Erasable Programmable Read-Only Memory). The modules described herein may be implemented as either software and/or hardware modules and may be stored in any type of non-transitory computer-readable medium or other storage device. Some non-limiting examples of a non-transitory computer-readable medium include CDs, DVDs, flash memory, and hard disk drives.

Figure 1:
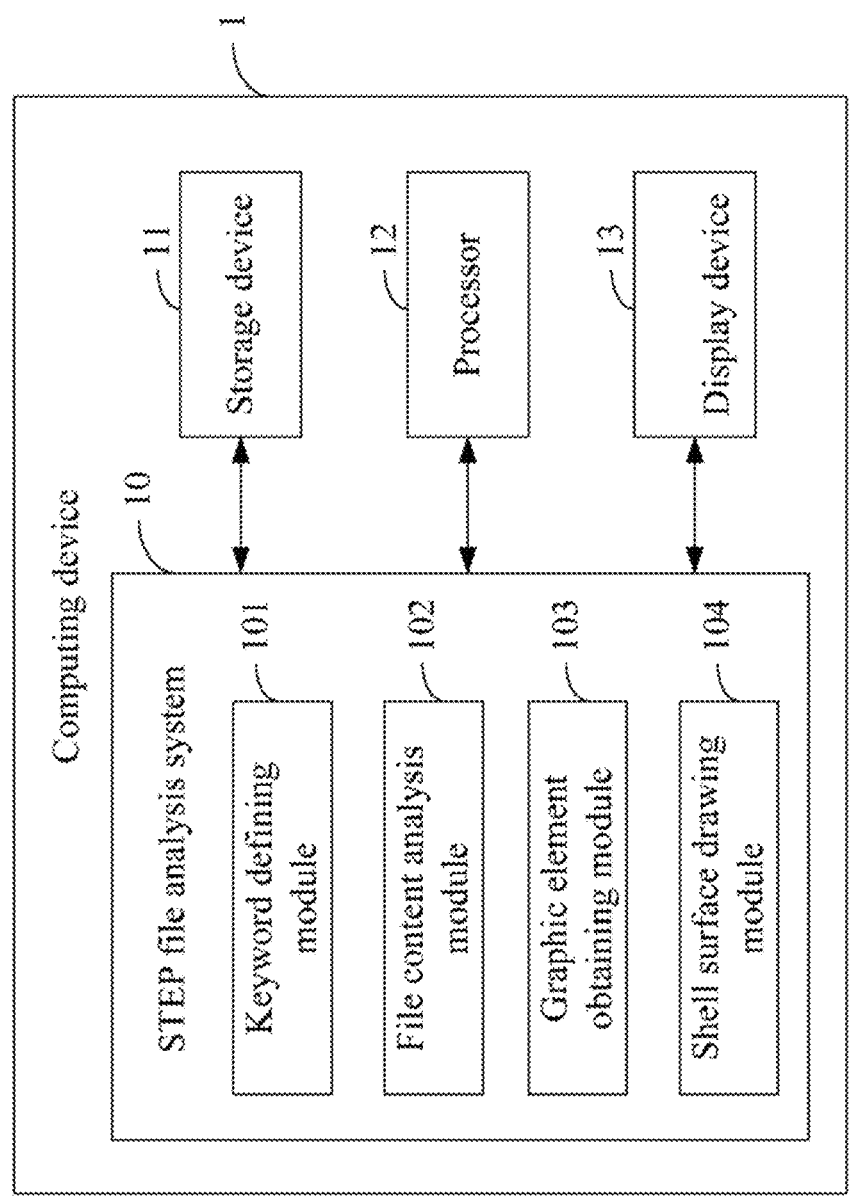
FIG. 1 is a block diagram of one embodiment of a computing device including a STEP file analysis system.

FIG. 1 is a block diagram of one embodiment of a computing device 1 including a STEP (standardized exchange of product) file analysis system 10. In the embodiment, the computing device 1 further includes a storage device 11, a processor 12, and a display device 13. The STEP file analysis system 10 may include a plurality of functional modules that are stored in the storage device 11 and executed by the processor 12. FIG. 1 is only one example of the computing device 1, other examples may include more or fewer components than those shown in the embodiment, or have a different configuration of the various components.

The storage device 11 stores a plurality of STEP formatted files (hereinafter "the STEP files") of a product to be measured (hereinafter "the measurement product"). In the embodiment, each of the STEP files includes a plurality of geometrical data on the measurement product, and is most widely used in data exchange in the design process of the measurement product. In one embodiment, the storage device 11 may be an internal storage device, such as a random access memory (RAM) for temporary storage of information, and/or a read only memory (ROM) for permanent storage of information. In some embodiments, the storage device 11 may also be an external storage device, such as an external hard disk, a storage card, or a data storage medium.

Figure 2:
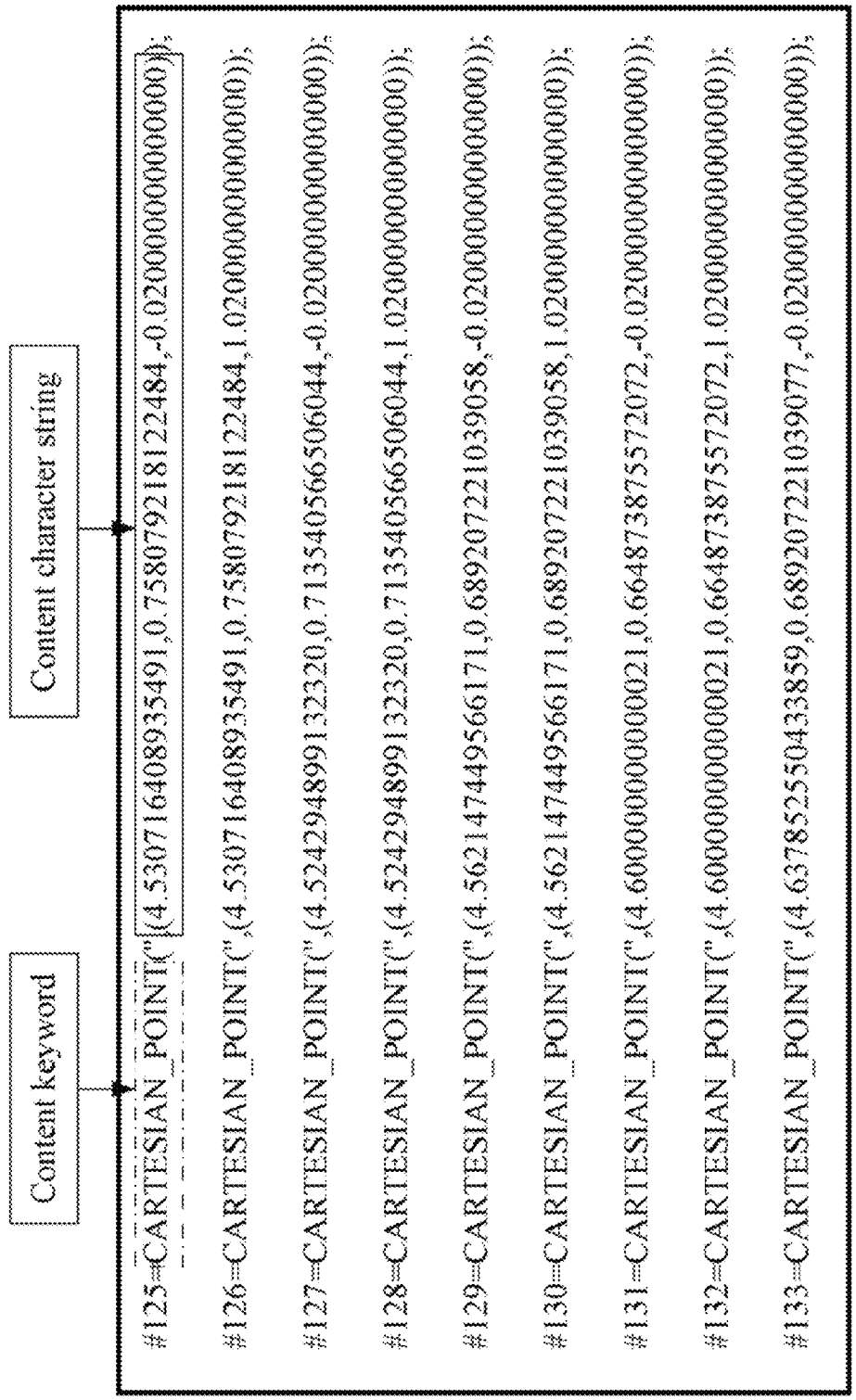
FIG. 2 is a schematic diagram illustrating one example of a STEP file of the measurement graphics.

FIG. 2 is a is a schematic diagram illustrating one example of a STEP file stored in the storage device 12. In the embodiment, the STEP file contains geometrical data that describes a plurality of graphic elements of the measurement graphics, such as rectangular solids, cylinders, spheres, and ellipsoids. The geometrical data can be easily read from the STEP file with one per line of file content of the STEP file. In one embodiment, each line of the file content starts from a line number of each line such as number #1, . . . , number #125, . . . , and number #133, and ends a division sign such as a semicolon ";" for example. Each line of the file content includes a content keyword and a content character string. The content keyword is extracted between an equal sign "=" and a left bracket sign "(" from each line of the file content, and describes a type of a graphic element, such as a cylinder type or a sphere type. The content character string is extracted between the left bracket sign "(" and a right bracket sign ")" from each line of the file content, and describes graphic information of the graphic element. The graphic information may include a type of the graphic element and coordinate values of the graphic element. For example, a coordinate value of a center point of the graphic element is described as (4.530716408935491, 0.758079218122484, −0.020000000000000).

In one embodiment, the STEP file analysis system 10 includes a keyword defining module 101, a file content analysis module 102, a graphic element obtaining module 103, and a shell surface drawing module 104. The modules 101-104 may comprise computerized instructions in the form of one or more programs that are stored in the storage device 11 and executed by the at least one processor 12. A detailed descriptions of each module will be given in the following paragraphs.

Figure 3:
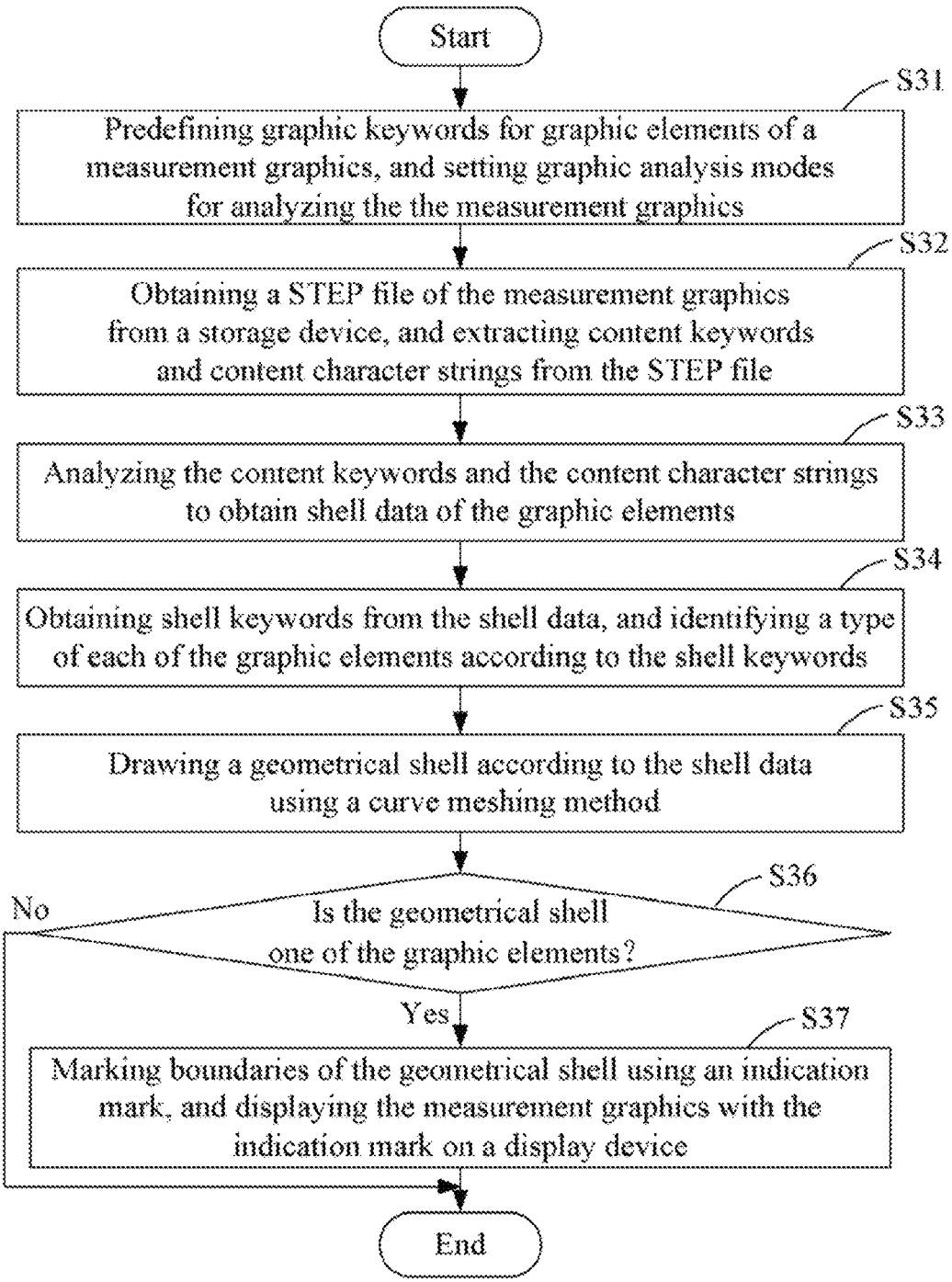
FIG. 3 is a flowchart of one embodiment of a method for analyzing a STEP file of a measurement graphics using the computing device of FIG. 1.

FIG. 3 is a flowchart of one embodiment of a method for analyzing a STEP formatted file of a measurement graphics using the computing device 1 of FIG. 1. In the embodiment, the measurement graphics may be a drawings of a motherboard of a computer, or a drawings of a printed circuit board (PCB) of an electronic device. Depending on the embodiment, additional steps may be added, others removed, and the ordering of the steps may be changed.

Figure 9:
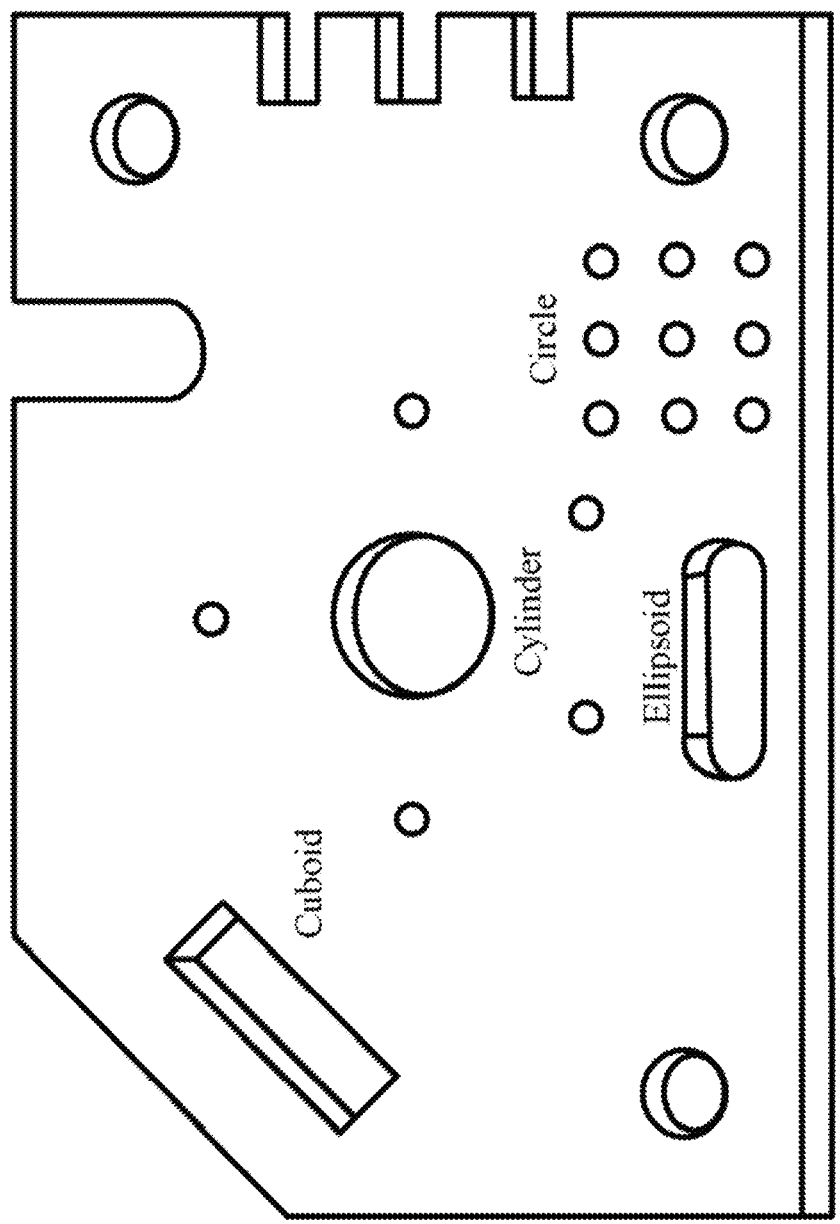
FIG. 9 is a schematic diagram illustrating one example of a measurement graphics of the measurement product.

In step S31, the keyword defining module 101 predefines graphic keywords for graphic elements of the measurement graphics and sets a plurality of graphics analysis modes for analyzing the measurement graphics, and stores the graphic keywords and the graphics analysis modes in the storage device 11. In one embodiment, the measurement graphics may be a two-dimensional (2D) or three-dimensional (3D) drawings that includes points, lines, planes, and circles. Referring to FIG. 9, the measurement graphics includes a plurality of rectangular solids, cylinders, spheres, and ellipsoids. Each of the graphic keywords is used to describe characteristic data of a graphic element of the measurement graphics. For example, the graphic keyword of a point is represented by a keyword "POINT," the graphic keyword of a line is represented by a keyword "LINE," and the graphic keyword of a circle is represented by a keyword "CIRCLE."

In step S32, the file content analysis module 102 obtains a STEP file of the measurement graphics from the storage device 11, and extracts a content keyword and a content character string from each line of file content of the STEP file. Referring to FIG. 2, the character string "CARTESIAN_POINT" is a content keyword of the number #125 line, and the character string "(4.530716408935491, 0.758079218122484, −0.020000000000000)" is a content character string of the number #125 line. The detailed description of step S32 is described in FIG. 4.

In step S33, the graphic element obtaining module 103 analyzes the content keywords and the content character strings to obtain shell data of the graphic elements. In one embodiment, the shell data is used to describe a geometrical shell of the graphic element, such as points, lines, planes, and circles. The detailed description of step S33 is described in FIG. 5.

In step S34, the graphic element obtaining module 103 obtains shell keywords from the shell data, and identifies a type of each of the graphic elements according to the shell keywords. For example, the graphic element obtaining module 103 identifies a geometrical shell having a shell keyword "POINT" as a point of the graphic element, identifies a geometrical shell having a shell keyword "LINE" as a line of the graphic element, and identifies a geometrical shell having a shell keyword "CIRCLE" as a circle of the graphic element.

In step S35, the shell surface drawing module 104 draws a geometrical shell of the measurement graphics according to the shell data using a curve meshing method. In one embodiment, the curve meshing method is a point fitting process of constructing a geometrical curve using different mesh grids of measurement points of the measurement product. The detailed description of step S35 is described in FIG. 6.

In step S36, the shell surface drawing module 104 determines whether the geometrical shell is one of the graphic elements of the measurement graphics. If the geometrical shell is one of the graphic elements of the measurement graphics, step S37 is implemented. Otherwise, if the geometrical shell is not one of the graphic elements of the measurement graphics, the process is ended.

In step S37, the shell surface drawing module 104 marks boundaries of the geometrical shell using an indication mark, and displays the measurement graphics with the indication mark on the display device 13. In one embodiment, the shell surface drawing module 104 may mark the boundaries of the geometrical shell using a colorized line, such as a red line or a blue line. In other embodiments, the shell surface drawing module 104 may highlight the boundaries of the geometrical shell. FIG. 9 is a schematic diagram illustrating one example of a measurement graphics of the measurement product, which includes a plurality of rectangular solids, cylinders, spheres, and ellipsoids.

Figure 4:
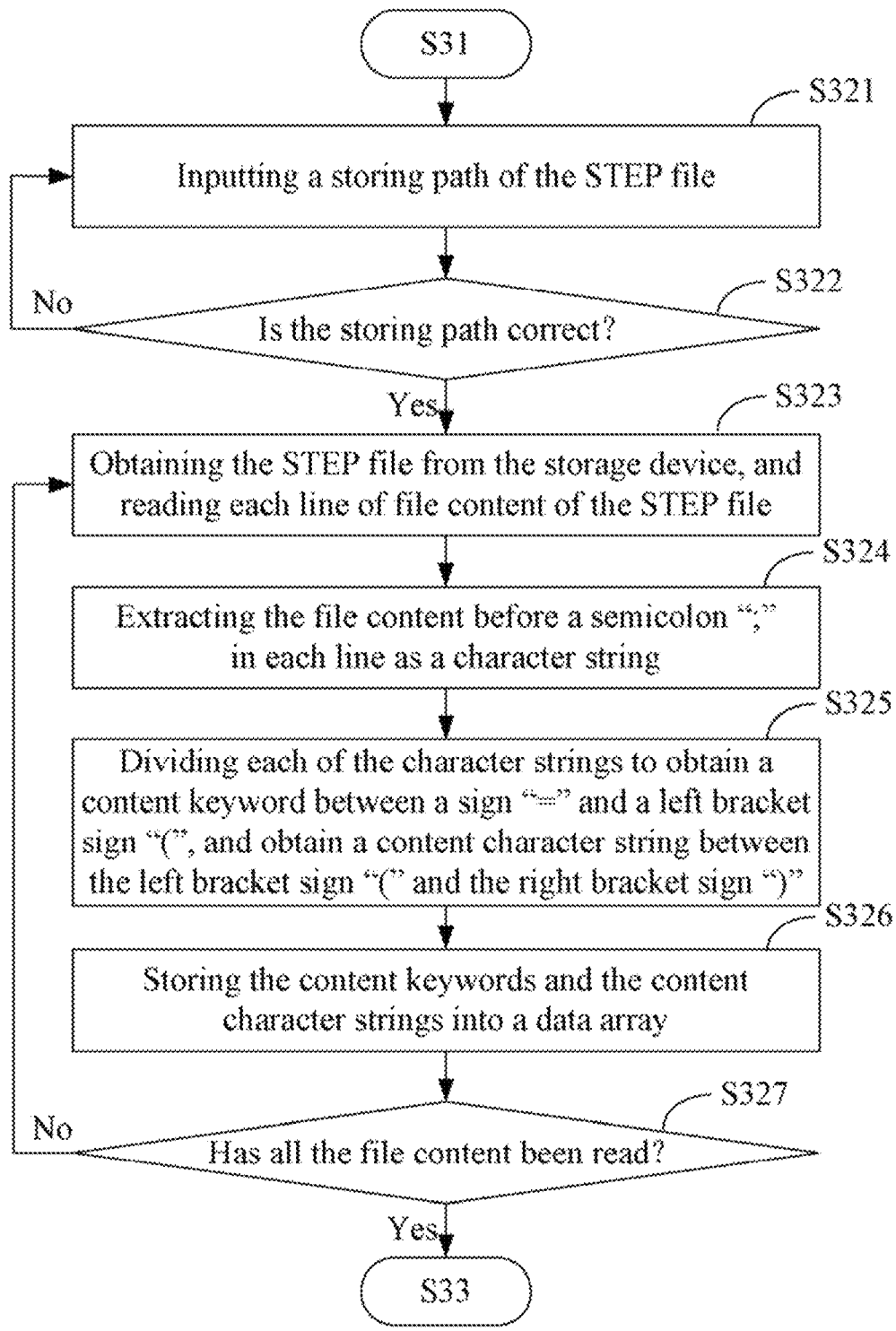
FIG. 4 is a detailed flowchart of step S32 of FIG. 3.

FIG. 4 is a detailed flowchart of step S32 in FIG. 3. In step S321, a user inputs a storing path of the STEP file from an input device (e.g., a keyboard) of the computing device 1. For example, the storing path is D:\\storage\STEP. In step S322, the file content analysis module 102 determines whether the STEP file exists in the storing path. If the STEP file exists in the storing path, step S323 is implemented. Otherwise, if the STEP file does not exist in the storing path, the process returns to step S321.

In step S323, the file content analysis module 102 obtains the STEP file from the storage device 12, and reads each line of file content of the STEP file. In step S324, the file content analysis module 102 extracts a character string before a semicolon ";" of each line from the file content of the STEP file. In step S325, the file content analysis module 102 divides each of the character strings to obtain a content keyword between an equal sign "=" and a left bracket sign "(" from each line of the file content, and to obtain a content character string between the left bracket sign "(" and the right bracket sign ")" from each line of the file content. In step S326, the file content analysis module 102 stores the content keywords and the content character strings into a data array. In step S327, the file content analysis module 102 determines whether all the content of the STEP file have been read. If any content of the STEP file has not been read, the process returns to step S323. Otherwise, if all the content of the STEP file have been read, step S33 is implemented.

Figure 5:
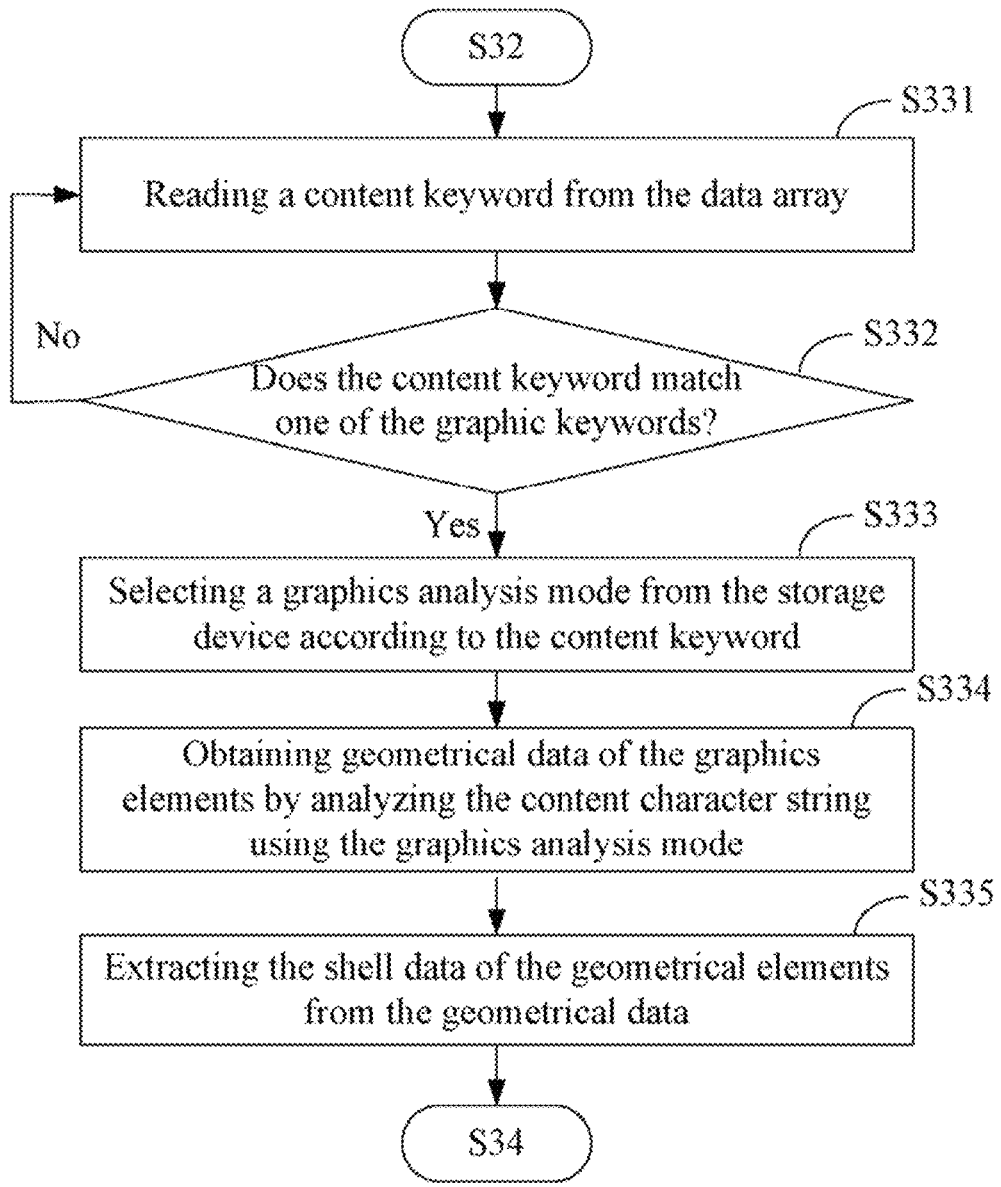
FIG. 5 is a detailed flowchart of step S33 of FIG. 3.

FIG. 5 is a detailed flowchart of step S33 in FIG. 3. In step S331, the graphic element obtaining module 103 reads a content keyword from the data array. In step S332, the graphic element obtaining module 103 determines whether the content keyword matches one of the predefined graphic keywords. If the content keyword does not match one of the predefined graphic keywords, the process returns to step S331. Otherwise, if the content keyword matches one of the predefined graphic keywords, step S333 is implemented.

In step S333, the graphic element obtaining module 103 selects a graphics analysis mode from the predefined graphics analysis mode stored in the storage device 11 according to the content keyword. In step S334, the graphic element obtaining module 103 obtains the geometrical data of the graphics element by analyzing the content character string using the graphics analysis mode. In step S335, the graphic element obtaining module 103 extracts the shell data of the geometrical element from the geometrical data.

Figure 6:
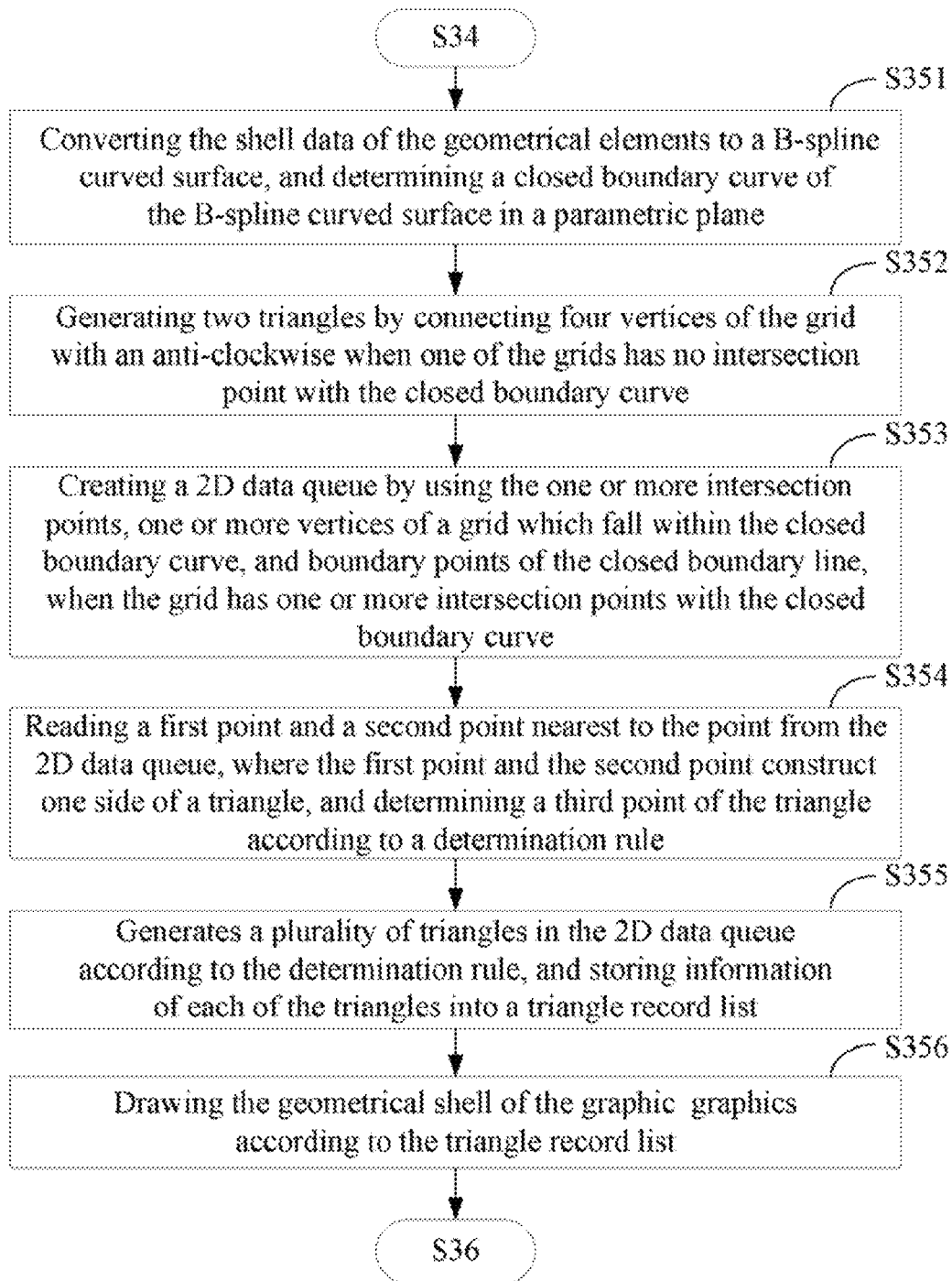
FIG. 6 is a detailed flowchart of step S35 of FIG. 3.
Figure 7:
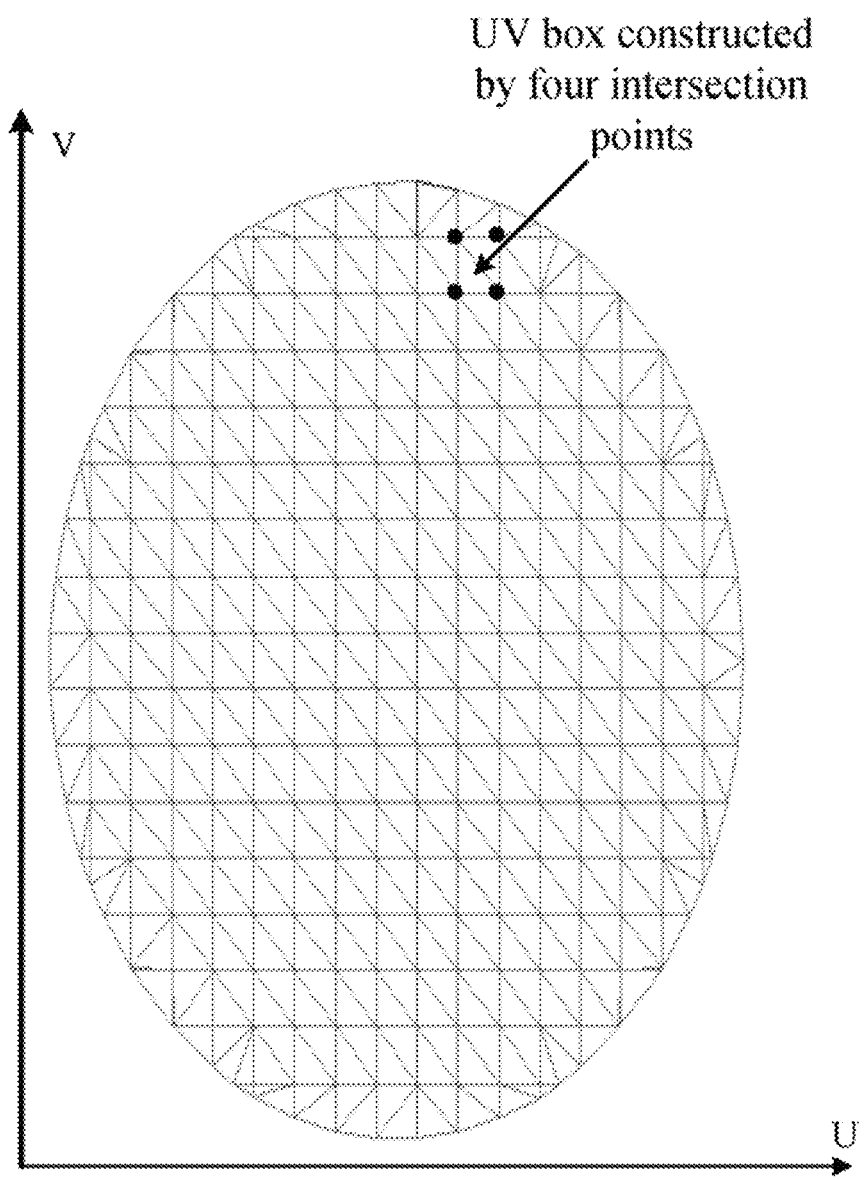
FIG. 7 and FIG. 8 are schematic diagrams illustrating one exemplary of meshing a geometrical shell using a plurality of triangles.

FIG. 6 is a detailed flowchart of step S35 in FIG. 3. In step S351, the shell surface drawing module 104 converts the shell data of the geometrical elements to a B-spline curved surface, and determines a closed boundary curve of the B-spline curved surface in a parametric plane. Referring to FIG. 7, the shell surface drawing module 104 further divides the closed boundary curve to obtain a plurality of grids (as shown in FIG. 7) using a plurality of horizontal lines (hereinafter referred to "U-lines") and vertical lines (hereinafter referred to "V-lines").

Figure 8:
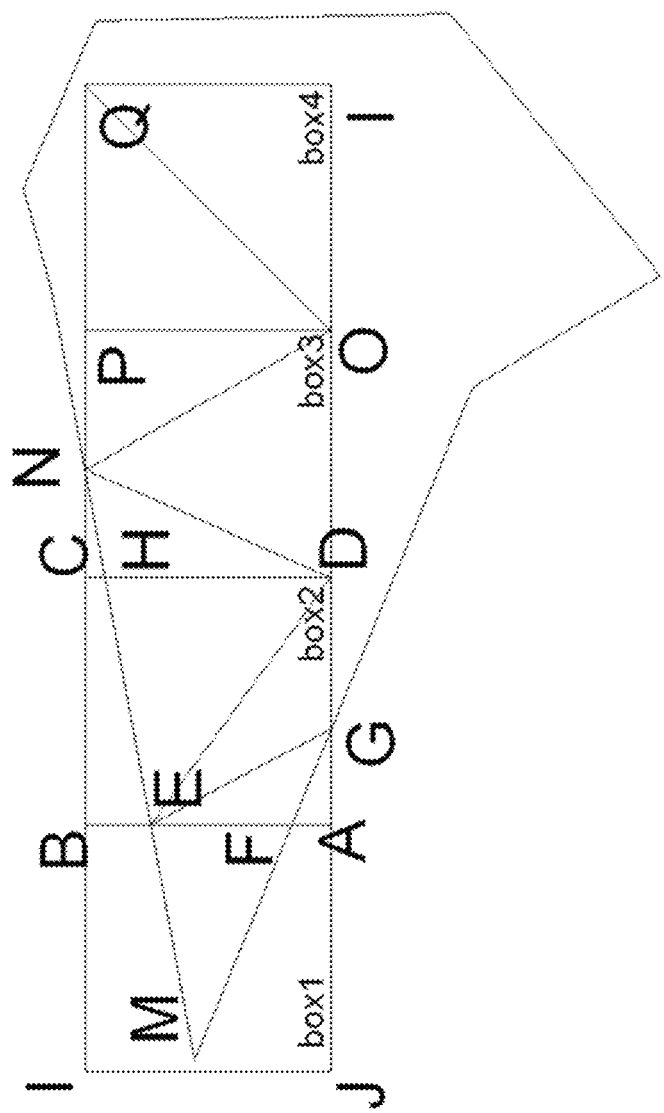

In step S352, the shell surface drawing module 104 generates two triangles by connecting four vertices of a grid in an anti-clockwise direction when one of the grids has no intersection point with the closed boundary curve. For example, as shown in FIG. 8, four vertices "P," "Q," "I," and "O" of a grid "box4" all fall within the closed boundary curve, then the meshing module 102 generates two triangles "OQP" and "OIQ" by connecting the four vertices "P," "Q," "I," and "O" in the anti-clockwise.

In step S353, the shell surface drawing module 104 creates a 2D data queue by using the one or more intersection points, one or more vertices of a grid which does have contact with the closed boundary curve, and boundary points of the closed boundary line, when the grid has one or more intersection points with the closed boundary curve. For example, as shown in FIG. 8, a boundary point "M" falls in a grid "box1," and the grid "box1" has two intersection points "E" and "F" with the closed boundary curve. A vertex "D" of a grid "box2" is in contact with the closed boundary curve, and the grid "box2" has four vertices "E," "F," "C," and "G" on the closed boundary curve. Then, the shell surface drawing module 104 uses the points "M," "E," "F," "C," "D," and "G" to form the 2D data queue.

In step S354, the shell surface drawing module 104 reads a first point and a second point nearest to the first point from the 2D data queue, where the first point and the second point are one side of a triangle. The meshing module 102 further determines a third point of the triangle according to a determination rule that there is no point of the 2D data queue in a circumcircle of the triangle which is consisting of the first point, the second point and the third point.

In S355, the shell surface drawing module 104 generates a plurality of triangles in the 2D data queue according to the determination rule, and stores information of each of the triangles into a triangle record list T.

In step S356, the shell surface drawing module 104 draws the geometrical shell of the measurement graphics according to the triangle record list, and displays the geometrical shell of the measurement graphics on the display device 13. Referring to FIG. 9, the geometrical shell may be rectangular solids, cylinders, spheres, or ellipsoids, which contain a plurality of points, lines, planes, and circles.

All of the processes described above may be embodied in, and fully automated via, functional code modules executed by one or more general purpose processors of computing devices. The code modules may be stored in any type of non-transitory readable medium or other storage device. Some or all of the methods may alternatively be embodied in specialized hardware. Depending on the embodiment, the non-transitory readable medium may be a hard disk drive, a compact disc, a digital video disc, a tape drive or other suitable storage medium.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A computing device, comprising:
    a storage device;
    at least one processor; and
    one or more programs stored in the storage device and executed by the at least one processor, the one or more programs comprising:
    a keyword defining module that predefines graphic keywords for graphic elements of a measurement graphics, sets graphics analysis modes for analyzing the measurement graphics, and stores the graphic keywords and the graphics analysis modes in the storage device;
    a file content analysis module that obtains a STEP (standardized exchange of product) formatted file of the measurement graphics from the storage device, extracts a content keyword and a content character string from each line of the STEP formatted file, and stores the content keywords and the content character strings into a data array;
    a graphic element obtaining module that analyzes the content keywords and the content character strings to obtain shell data of the graphic elements by performing steps of: reading one of the content keywords from the data array; determining whether the content keyword matches one of the predefined graphic keywords; reading another content keyword from the data array if the content keyword does not match one of the predefined graphic keywords; and selecting a graphics analysis mode from the predefined graphics analysis modes stored in the storage device according to the content keyword, obtaining the geometrical data of the graphics element by analyzing the content character using the graphics analysis mode, and extracting the shell data of the geometrical element from the geometrical data, if the content keyword matches one of the predefined graphic keywords; and
    a shell surface drawing module that draws a geometrical shell of the measurement graphics according to the shell data using a curve meshing method, marks boundaries of the geometrical shell using an indication marks, and displays the measurement graphics with the indication marks on a display device of the computing device.

2. The computing device according to claim 1, wherein the graphic element obtaining module further obtains a plurality of shell keywords from the shell data, and identifies a type of each of the graphic elements according to the shell keywords.

3. The computing device according to claim 1, wherein the file content analysis module extracts the content keyword and the content character string from each line of the STEP formatted file by performing steps of:
    reading each line of file content of the STEP formatted file;
    extracting a character string before a semicolon ";" of each line from the file content of the STEP formatted file; and
    dividing each of the character strings to obtain the content keyword between an equal sign "=" and a left bracket sign "(" from each line of the file content, and to obtain the content character string between the left bracket sign "(" and the right bracket sign ")" from each line of the file content.

4. The computing device according to claim 1, wherein the shell surface drawing module draws a geometrical shell of the measurement graphics according to the shell data using the curve meshing method by performing steps of:
    converting the shell data of the geometrical elements to a B-spline curved surface, and determining a closed boundary curve of the B-spline curved surface in a parametric plane;
    generating two triangles by connecting four vertices of a grid in an anti-clockwise direction when one of the grids has no intersection point with the closed boundary curve;
    creating a data queue by using the one or more intersection points, one or more vertices of a grid which does have contact with the closed boundary curve, and boundary points of the closed boundary line, when the grid has one or more intersection points with the closed boundary curve;
    reading a first point and a second point nearest to the first point from the data queue, wherein the first point, the second point are one side of a triangle;
    determining a third point of the triangle according to a determination rule that there is no point of the data queue in a circumcircle of the triangle;

generating a plurality of triangles according to the determination rule; and drawing the geometrical shell of the measurement graphics based on the triangles, and displaying the geometrical shell of the measurement graphics on the display device.

5. The computing device according to claim 1, wherein the STEP formatted file contains geometrical data that describes a plurality of graphic elements of the measurement graphics, and the geometrical data are read from the STEP formatted file with one per line of the STEP formatted file.

6. A method for analyzing a STEP (standardized exchange of product) formatted file of a measurement graphics using a computing device, the method comprising steps of:

predefining graphic keywords for graphic elements of the measurement graphics, and setting graphics analysis modes for analyzing the measurement graphics;

storing the graphic keywords and the graphics analysis modes in a storage device of the computing device;

obtaining the STEP formatted file of the measurement graphics from the storage device;

extracting a content keyword and a content character string from each line of the STEP formatted file;

storing the content keywords and the content character strings into a data array;

analyzing the content keywords and the content character strings to obtain shell data of the graphic elements, wherein the analyzing step comprises: reading one of the content keywords from the data array; determining whether the content keyword matches one of the predefined graphic keywords; reading another content keyword from the data array if the content keyword does not match one of the predefined graphic keywords; and selecting a graphics analysis mode from the predefined graphics analysis modes stored in the storage device according to the content keyword, obtaining the geometrical data of the graphics element by analyzing the content character using the graphics analysis mode, and extracting the shell data of the geometrical element from the geometrical data, if the content keyword matches one of the predefined graphic keywords;

drawing a geometrical shell of the measurement graphics according to the shell data using a curve meshing method; and marking boundaries of the geometrical shell using an indication mark, and displaying the measurement graphics with the indication mark on a display device of the computing device.

7. The method according to claim 6, further comprising:

obtaining a plurality of shell keywords from the shell data, and identifying a type of each of the graphic elements according to the shell keywords.

8. The method according to claim 6, wherein the extracting step comprises:

reading each line of file content of the formatted STEP file;

extracting a character string before a semicolon ";" of each line from the file content of the STEP formatted file; and dividing each of the character strings to obtain the content keyword between an equal sign "=" and a left bracket sign "(" from each line of the file content, and to obtain the content character string between the left bracket sign "(" and the right bracket sign ")" from each line of the file content.

9. The method device according to claim 6, wherein the drawing step comprises:

converting the shell data of the geometrical elements to a B-spline curved surface, and determining a closed boundary curve of the B-spline curved surface in a parametric plane;

generating two triangles by connecting four vertices of a grid in an anti-clockwise direction when one of the grids has no intersection point with the closed boundary curve;

creating a data queue by using the one or more intersection points, one or more vertices of a grid which does have contact with the closed boundary curve, and boundary points of the closed boundary line, when the grid has one or more intersection points with the closed boundary curve;

reading a first point and a second point nearest to the first point from the data queue, wherein the first point, the second point are one side of a triangle;

determining a third point of the triangle according to a determination rule that there is no point of the data queue in a circumcircle of the triangle;

generating a plurality of triangles according to the determination rule; and drawing the geometrical shell of the measurement graphics based on the triangles, and displaying the geometrical shell of the measurement graphics on the display device.

10. The method device according to claim 6, wherein the STEP formatted file contains geometrical data that describes a plurality of graphic elements of the measurement graphics, and the geometrical data are read from the STEP formatted file with one per line of the STEP formatted file.

11. A non-transitory computer-readable storage medium having stored thereon instructions that, when executed by at least one processor of a computing device, causes the computing device to perform a method for analyzing a STEP (standardized exchange of product) formatted file of a measurement graphics, the method comprising steps of:

predefining graphic keywords for graphic elements of the measurement graphics, and setting graphics analysis modes for analyzing the measurement graphics;

storing the graphic keywords and the graphics analysis modes in a storage device of the computing device;

obtaining the STEP formatted file of the measurement graphics from the storage device;

extracting a content keyword and a content character string from each line of the STEP formatted file;

storing the content keywords and the content character strings into a data array;

analyzing the content keywords and the content character strings to obtain shell data of the graphic elements, wherein the analyzing step comprises: reading one of the content keywords from the data array; determining whether the content keyword matches one of the predefined graphic keywords; reading another content keyword from the data array if the content keyword does not match one of the predefined graphic keywords; and selecting a graphics analysis mode from the predefined graphics analysis modes stored in the storage device according to the content keyword, obtaining the geometrical data of the graphics element by analyzing the content character using the graphics analysis mode, and extracting the shell data of the geometrical element from the geometrical data, if the content keyword matches one of the predefined graphic keywords;

drawing a geometrical shell of the measurement graphics according to the shell data using a curve meshing method; and marking boundaries of the geometrical shell using an indication mark, and displaying the measurement graphics with the indication mark on a display device of the computing device.

12. The storage medium according to claim 11, wherein the method further comprises:
obtaining a plurality of shell keywords from the shell data, and identifying a type of each of the graphic elements according to the shell keywords.

13. The storage medium according to claim 11, wherein the extracting step comprises:
reading each line of file content of the STEP formatted file;
extracting a character string before a semicolon ";" of each line from the file content of the STEP formatted file; and
dividing each of the character strings to obtain the content keyword between an equal sign "=" and a left bracket sign "(" from each line of the file content, and to obtain the content character string between the left bracket sign "(" and the right bracket sign ")" from each line of the file content.

14. The storage medium according to claim 11, wherein the drawing step comprises:
converting the shell data of the geometrical elements to a B-spline curved surface, and determining a closed boundary curve of the B-spline curved surface in a parametric plane;
generating two triangles by connecting four vertices of a grid in an anti-clockwise direction when one of the grids has no intersection point with the closed boundary curve;
creating a data queue by using the one or more intersection points, one or more vertices of a grid which does have contact with the closed boundary curve, and boundary points of the closed boundary line, when the grid has one or more intersection points with the closed boundary curve;
reading a first point and a second point nearest to the first point from the data queue, wherein the first point, the second point are one side of a triangle;
determining a third point of the triangle according to a determination rule that there is no point of the data queue in a circumcircle of the triangle;
generating a plurality of triangles according to the determination rule; and
drawing the geometrical shell of the measurement graphics based on the triangles, and displaying the geometrical shell of the measurement graphics on the display device.

15. The storage medium according to claim 11, wherein the STEP formatted file contains geometrical data that describes a plurality of graphic elements of the measurement graphics, and the geometrical data are read from the STEP formatted file with one per line of the STEP formatted file.

* * * * *